(12) United States Patent
Klimczak et al.

(10) Patent No.: US 9,840,770 B2
(45) Date of Patent: Dec. 12, 2017

(54) GENERATING A HIGHLY IONIZED PLASMA IN A PLASMA CHAMBER

(71) Applicant: TRUMPF Huettinger Sp. z.o.o., Zielonka (PL)

(72) Inventors: Andrzej Klimczak, Warsaw (PL); Pawel Ozimek, Warsaw (PL); Rafal Bugyi, Warsaw (PL)

(73) Assignee: TRUMPF Huettinger Sp. z o. o., Zielonka (PL)

( * ) Notice: Subject to any disclaimer, the term of this patent is extended or adjusted under 35 U.S.C. 154(b) by 162 days.

(21) Appl. No.: 14/138,400

(22) Filed: Dec. 23, 2013

(65) Prior Publication Data
US 2014/0174909 A1    Jun. 26, 2014

Related U.S. Application Data

(63) Continuation of application No. PCT/EP2012/062367, filed on Jun. 26, 2012.

(60) Provisional application No. 61/501,724, filed on Jun. 27, 2011.

(30) Foreign Application Priority Data

Jun. 27, 2011    (EP) ................................ 11171580

(51) Int. Cl.
*C23C 14/46*    (2006.01)
*H01J 37/34*    (2006.01)

(52) U.S. Cl.
CPC .......... *C23C 14/46* (2013.01); *H01J 37/3405* (2013.01)

(58) Field of Classification Search
CPC .. C23C 14/3485; C23C 14/46; H01J 37/3405; H01J 37/3467
(Continued)

(56) References Cited

U.S. PATENT DOCUMENTS 5,015,493 A * 5/1991 Gruen ..................... C23C 14/32
                                                       204/298.05
6,306,265 B1 * 10/2001 Fu ....................... H01J 37/3455
                                                       204/192.12
(Continued)

FOREIGN PATENT DOCUMENTS

JP        2010116578 A    5/2010
WO    WO1998040532 A1    9/1998

OTHER PUBLICATIONS

Almi et al., "Plastic dynamics in a highly ionized pulsed magnetron discharge", Plasma Sources Science and Technology, Institute of Physics Publishing, Bristol, Great Britain, vol. 14, No. 3, pp. 525-531, 2005.

(Continued)

*Primary Examiner* — Rodney McDonald
(74) *Attorney, Agent, or Firm* — Fish & Richardson P.C.

(57) ABSTRACT

A method of generating a highly ionized plasma in a plasma chamber. A neutral gas is provided to be ionized in the plasma chamber at pressure below 50 Pa. At least one high energy high power electrical pulse is supplied with power equal or larger than 100 kW and energy equal or larger than 10 J, to at least one magnetron cathode in connection with a target in the plasma chamber. A highly ionized plasma is produced directly from the neutral gas in a plasma volume such that the plasma volume cross section increases during a current rise period. Atoms are sputtered from the target with the highly ionized plasma. At least part of the sputtered atoms are ionized.

21 Claims, 8 Drawing Sheets

(58) Field of Classification Search
USPC .................................. 204/192.12, 298.08
See application file for complete search history.

(56) References Cited

U.S. PATENT DOCUMENTS

| | | | |
|---|---|---|---|
| 6,413,382 B1* | 7/2002 | Wang ................. | H01J 37/3408 204/192.12 |
| 7,147,759 B2* | 12/2006 | Chistyakov .............. | 204/192.12 |
| 2005/0092596 A1* | 5/2005 | Kouznetsov ............. | 204/192.12 |
| 2011/0011737 A1 | 1/2011 | Wu | |

OTHER PUBLICATIONS

Gudmundsson et al., "Evolution of the electron energy distribution and plasma parameters in a pulsed magnetron discharge", Applied Physics Letters, AIP, American Institute of Physics, Melville, New York, vol. 78, No. 22, pp. 3427-3429, 2001.

Helmersson et al., "Ionized physical vapor deposition (IPVD): a review of technology and applications", Thin Solid Films, Elsevier-Sequoia, S.A., Lausanne, Switzerland, vol. 513, No. 1-2, pp. 1-24, 2006.

Kouznetsov et al., "A novel pulsed magnetron sputter technique utilizing very high target power densities", Surface and Coatings Technologies, Elsevier, Amsterdam, the Netherlands, vol. 122, pp. 290-293, 1999.

European Search Report from corresponding European Application No. 11 17 1580, dated Nov. 8, 2011, 11 pages.

International Preliminary Report on Patentability and Written Opinion from corresponding PCT Application No. PCT/EP2012/062367, dated Jan. 7, 2014, 10 pages.

* cited by examiner

GENERATING A HIGHLY IONIZED PLASMA IN A PLASMA CHAMBER

TECHNICAL FIELD

The present disclosure relates to generating a highly ionized plasma in a plasma chamber.

BACKGROUND

In a typical sputter coating process, an electric discharge produces electrons that collide with a sputtering gas, thereby ionizing the gas. This sputter process is typically in a pressure range between 10 Pa and 0.1 Pa. In this pressure range the number of atoms or molecules is between $5*10^{15}$ cm$^{-3}$ and $2*10^{13}$ cm$^{-3}$. As ions bombard a target, atoms are detached from the target, the atoms deposit at a substrate to be coated. The process of detaching atoms from the target is called sputter process. This sputter process can also be used for etching. In some systems, improved target utilization and coating uniformity may be achieved by producing a highly ionized plasma in the vicinity of the target. In such systems, a partially ionized plasma is first generated at a low voltage, and then a highly ionized plasma is generated through the application of high power discharge pulses. A highly ionized plasma in this context is reached, when the number of ions is above $10^{12}$ cm$^{-3}$.

However, a high power discharge pulse in combination with an upstream low ionization step has been found to reduce the adhesion of the film produced during the sputtering and may result in target poisoning during reactive sputtering processes. Furthermore, the need to apply a low voltage during the first period of time limits the simultaneous use of the power supply for other purposes, for example, etching.

In EP 1 560 943 B1 a two-step approach for creating a highly ionized plasma is described. For a first period of time a low voltage is applied to a discharge gap and then for a short period of time a higher voltage is applied. This leads at first to a low ionization of the gas and then to a high ionization of the gas.

SUMMARY

It is the object of the present invention, to provide a method and an apparatus for producing a highly ionized plasma in a plasma chamber being suitable for etching and building high adhesion during sputter deposition, and avoiding poisoning of the electrodes, target, plasma chamber, or substrate during reactive sputtering.

In a first aspect generating a highly ionized plasma in a plasma chamber, is achieved by:
a. providing a neutral gas to be ionized in the plasma chamber at pressure below 50 Pa;
b. supplying at least one high energy, high power electrical pulse with power equal or larger than 100 kW and energy equal or larger than 10 J to at least one magnetron cathode in connection with a target in the plasma chamber
c. producing a highly ionized plasma directly from the neutral gas in a plasma volume such that the plasma volume cross section increases during a current rise period
d. sputtering atoms from the target with the highly ionized plasma,
e. ionizing at least part of the sputtered atoms.

A plasma is a state of matter similar to a gas in which a certain portion of the particles are ionized. Despite the fact that the plasma contains free charge particles, in the macroscopic scale the plasma is electrically neutral. This means that it contains the same number of positive and negative charges in an equilibrium state. According to the invention a highly ionized plasma is generated directly from the neutral gas by influencing the conditions in the plasma chamber and thus the plasma generation process during a current rise time period.

The duration of the high energy, high power pulse may be shorter than 500 µs, preferably not longer than 300 µs, more preferably not longer than 200 µs. This means the whole energy is applied in a very short pulse. The voltage rise time and the current rise time must therefore be very short. This leads to a very high ionization of the plasma.

In an aspect the plasma volume cross section increases during a current rise period while maintaining a substantially constant current density and/or a substantially constant ionization degree. So a higher adhesion during sputter deposition can be achieved. Or in other words: a substantially constant current density and/or a substantially constant ionization degree is maintained while the plasma volume cross section increases during a current rise period.

According to this approach a highly ionized plasma is created directly from a neutral gas. During the current rise period a spatial growth of highly ionized regions in the plasma chamber may be initiated. This leads to a homogeneous, highly ionized plasma and thus improves target utilization.

A spatial growth of the plasma cross section means growth of current with substantially constant current density, i.e. I=S●J, where I=current, S=plasma volume cross section (rising value), and J=current density (constant). Hereby the current reflects a highly ionized plasma volume growth and not an ionization degree.

According to aspects of this method, the gas provided in the chamber can adopt a highly ionized plasma state without going through a weakly or low ionized plasma stage or other preparatory plasma stages such as glow discharge or arc discharge, i.e., a highly ionized plasma is produced directly from the neutral gas. The gas may go through one or several breakdown stages which do not form a plasma stage before going directly to a highly ionized plasma state. This is possible by providing a high enough energy which exceeds the ionization electric breakdown threshold instantaneously in an electric pulse. At the same time the current rise time may be controlled or the current pulse may shaped to achieve the highly ionized plasma without going through a low ionized plasma or an arc discharge state. The process development may be dependent on a large number of parameters, where the following are a list of the most important:

gas pressure,
gas mixture, especially when reactive gas is used,
target material,
temperature of the gas, target and plasma chamber,
strength and shape of the magnetic field,
strength and shape of the electric field,
direction of the electrical field in respect to the direction of the magnetic field,
velocity of the voltage rise and the current rise,
energy provided during the pulse,
power rise time,
duration of the pulse,
repetition rate of pulses
etc.

Due to the large number of parameters which influence the development into the highly ionized plasma and due to the mutual interactions of these parameters, it is advantageous to monitor the plasma development at least during start of operation and/or during maintenance intervals. With optical instruments such as electro-optical photography, spectroscopy, very fast CCD cameras, selected for the monitoring of the dedicated plasma process and with variation of the electrical, magnetic and physical as well as chemical settings it is possible to reach a set of parameters for the highly ionization plasma without going through an arc discharge or low ionized plasma. This is explained in more detail in the following. The monitoring of a plasma process is known in the art and described in Helmersson et al. "Ionized physical vapor deposition (IPVD): A review of technology and applications", Thin Solid Films, Elsevier-Sequoia S. A. Lausanne, C H, vol. 513, no. 1-2, (Aug. 14, 2006), pages 1-24 and in particular pages 9-11; this publication is cited as the 'IPVD Review' in the following.

At the beginning of the voltage rise of the high energy, high power pulse a number of free electrons may be provided to be accelerated by an electrical field caused by the pulse. This number of electrons may be provided by an electron source or by cosmic x-ray radiation or other methods. The accelerated free electrons in the gas may create an avalanche-type ionization process, which initiates an electric breakdown in the gas.

The high energy, high power pulse may produce or may be selected to produce at least as many ionized atoms of the provided gas as it produces ionized atoms of sputtered material. This helps achieving a highly ionized plasma in a short time and also improves the sputtering process. This improves the adhesion of deposited coatings with the sputtered atoms. In reactive processes also the reactive gas may be ionized. This leads to better yield in the sputter process and improved compound of the sputtered atoms or ions with the reactive gas and therefore also to better adhesion.

Electron avalanches may be initiated in the neutral gas prior to a steady plasma state. An electron avalanche is a process, in which a number of free electrons in a gas are subjected to strong acceleration by an electric field, ionizing the atoms of the gas by collision called impact ionization, thereby forming secondary electrons to undergo the same process in successive cycles. Electron avalanches are essential to the dielectric breakdown process within gases.

Ionization waves may be initiated prior to a steady plasma state. In particular, the voltage pulse may be applied between a cathode and an anode of the plasma chamber causing electron avalanches followed by ionization waves. The formation of the ionization waves is described in more detail in the following.

The avalanche type ionization process, the electron avalanches and the ionization waves are stages of breakdown. These stages of breakdown do not constitute a plasma state because, in contrast to a plasma, they are highly non-equilibrium, non-uniform in given space, have more negative than positive charges, and occur prior to the establishment of a sheath.

A high energy, high power pulse may be applied to at least one electrode, where the resulting voltage across the at least one electrode and a second electrode is higher than a static breakdown voltage of the neutral gas or a dynamic breakdown voltage and the pulses supply enough current and/or power rise capacity that a highly ionized plasma is generated without going through a low ionized plasma or through an arc discharge. This leads to very fast creation of a highly ionized plasma. The disadvantages associated with arc discharge or a low ionized plasma can be avoided. The static breakdown voltage is the minimum voltage that causes a portion of an insulator to become electrically conductive. A dynamic or pulse breakdown voltage refers to the fact that during specified time intervals a gap can sustain voltages which are higher than the static breakdown voltage without breakdown. But when the dynamic or pulse breakdown voltage will be reached, the gap becomes conductive much faster as if only the static breakdown voltage would be reached.

The high energy, high power pulse may be selected such that the voltage between the electrode and the plasma chamber or between an anode and a cathode in the plasma chamber reaches more than 80% of its maximum value, before the current density or the ionization degree in the plasma chamber reaches more than 80% of its maximum value. This ensures that the voltage, current and/or power pulse is large enough to create a highly ionized plasma in the plasma chamber directly from a neutral gas, without going through a low ionized plasma or an arc discharge.

The high energy, high power pulse may be selected such that the current density or the ionization degree in the plasma chamber reaches more than 30%, preferably more than 50%, more preferably more than 80%, even more preferably more than 90% of its maximum value, before the current into the electrode reaches more than 80% of its maximum value.

The high energy, high power pulse may be selected such that the number of avalanches my rise during the current rise period. This ensures the transformation of the neutral gas to a highly ionized plasma.

In another aspect generating a highly ionized plasma in a plasma chamber is achieved by:
a. providing a neutral gas to be ionized in the plasma chamber at pressure below 50 Pa;
b. supplying at least one high energy, high power electrical pulse with power equal or larger than 100 kW, in particular 500 kW, and energy equal or larger than 10 J, in particular 50 J, to at least one magnetron cathode in connection with a target in the plasma chamber
c. producing a highly ionized plasma directly from the neutral gas such that during a current rise period
d. the current density in the plasma chamber reaches more than 80% of its maximum value, before the current into the electrode reaches more than 80% of its maximum value.

According to aspects of this method, the gas provided in the chamber can adopt a highly ionized plasma state without going through a weakly or low ionized plasma stage or other preparatory plasma stages such as glow discharge or arc discharge, i.e., a highly ionized plasma is produced directly from the neutral gas. The gas may go through one or several breakdown stages which do not form plasma stages before going directly to a highly ionized plasma state. This leads to improved adhesion during sputter deposition, makes the plasma process suitable for etching, and avoids poisoning of the electrodes, target, plasma chamber, or substrate during reactive sputtering. According to the invention a highly ionized plasma is generated directly from the neutral gas by influencing the conditions in the plasma chamber and thus the plasma generation process during a current rise time period The monitoring of current density is known in the art. Disclosure of such a measurement may be found in 'IPVD Review' on page 9, FIG. 11 and description to FIG. 11.

This method can be combined with all above mentioned method steps individually or as a combination.

In another aspect generating a highly ionized plasma in a plasma chamber is achieved by:
a. providing a neutral gas to be ionized together with few free electrons in the plasma chamber;
b. supplying at least one high energy, high power electrical pulse with power equal or larger than 100 kW, in particular 500 kW, and energy equal or larger than 10 J, in particular 50 J, between an anode and a magnetron cathode in the plasma chamber in order to produce an electrical field between the anode and the cathode,
c. accelerating the free electrons in order to ionize atoms of the neutral gas and to generate secondary electrons,
d. deviate the direction of flow of accelerated electrons by a magnetic field
e. creating non-equilibrium or macroscopically not neutral ionization avalanches,
f. absorbing electrons at the anode,
g. building positive ion charges near the anode,
h. accelerating ionized gas atoms towards the cathode thereby building a first ionization wave,
i. sputtering target material from a target in electrical connection with the cathode,
j. ionizing the target atoms sputtered from the target.

Hence, according to this aspect of the invention also a highly ionized plasma is generated directly from the neutral gas by influencing the conditions in the plasma chamber.

According to aspects of this method, the gas provided in the chamber can adopt a highly ionized plasma state without going through a weakly or low ionized plasma stage or other preparatory plasma stages such as glow discharge or arc discharge. The gas may go through one or several breakdown stages which do not form plasma stages before going directly to a highly ionized plasma state. This leads to improved adhesion during sputter deposition, makes the plasma process suitable for etching, and avoids poisoning of the electrodes, target, plasma chamber, or substrate during reactive sputtering.

Also this method can be combined with all above mentioned method steps individually or as a combination.

In a further aspect a magnetically enhanced sputtering apparatus includes:
a. at least one magnet configured to provide a magnetic field in a magnetron configuration at the surface of a sputtering target, from which material is to be sputtered,
b. a plasma chamber configured to receive the sputtering target, the chamber having an inlet for introduction into the chamber of a neutral gas to be ionized,
c. an anode and a cathode in the chamber, the cathode in electrical connection with the target,
d. a high energy pulse power source configured to apply a high energy, high power electrical pulse with power equal or larger than 100 kW and energy equal or larger than 10 J between the anode and the cathode in the chamber,
e. wherein responsive to said high energy pulse power source a highly ionized plasma is generated directly from the neutral gas such that the plasma volume cross section increases during a current rise period.

Such an apparatus may be suitable for creating a highly ionized plasma without going through the stages of arc discharge or low ionization, i.e. for producing a plasma directly from a neutral gas.

The apparatus may be configured such that during at least part of the current rise period a substantially constant current density and/or a substantially constant ionization degree is maintained.

The voltage source may produce a voltage pulse such that a degree of ionization of at least $10^{12}$ cm$^{-3}$ is reached. Thus, a highly ionized plasma is produced, which is suitable for a sputtering or etching process.

In another aspect the invention relates to a high energy pulse power source for delivering electrical pulses for magnetically enhanced sputtering which is configured to produce a high energy, high power electrical pulse with power equal or larger than 100 kW, in particular 500 kW, and energy equal or larger than 10 J, in particular 50 J, to be supplied to at least one magnetron cathode of a plasma chamber for producing a highly ionized plasma from a neutral gas in the plasma chamber such that during a current rise period the plasma volume cross section increases.

The same advantages as for the corresponding method steps apply.

The source may be configured for maintaining a substantially constant current density and/or a substantially constant ionization degree during the current rise period.

In another aspect the invention also relates to a source for delivering electrical pulses for magnetically enhanced sputtering, the high energy pulse power source being configured to produce a high energy, high power electrical pulse with power equal or larger than 100 kW, in particular 500 kW, and energy equal or larger than 10 J, in particular 50 J, to be supplied to at least one magnetron cathode of a plasma chamber in less than 200 µs for producing a highly ionized plasma from a neutral gas in the plasma chamber, the source being configured such that the voltage between an anode and a cathode in a plasma chamber reaches more than 80% of its maximum value, before the current density reaches more than 80% of its maximum value.

Moreover, the high energy, high power pulse may be configured such that the current density in the plasma chamber reaches more than 30%, preferably more than 50%, more preferably more than 80%, even more preferably more than 90% of its maximum value, before the current into the electrode reaches more than 80% of its maximum value.

The high energy pulse power source may comprise a switch configured to be closed when the high energy, high power electrical pulses are produced and configured to be opened, when the current increases above a threshold value.

The high energy pulse power source may comprise a switch configured to be closed when the high energy, high power electrical pulses are produced, and may be configured to close again, when the current decreases under a second threshold value or after a predetermined time duration which is shorter than 50 µs.

The high energy pulse power sources described above may be used in an apparatus described earlier.

The high energy pulse power source or an apparatus for magnetically enhanced sputtering may comprise a matching circuit with configurable inductors and/or capacitors and/or resistors. The matching circuit may be part of the high energy pulse power source or may be provided external to the high energy pulse power source. In the latter case it may be part of an apparatus for magnetically enhanced sputtering mentioned above.

The high energy pulse power source or the apparatus for magnetically enhanced sputtering may comprise a pulse control which switches a plurality of transistors connected in series and/or in parallel simultaneously.

Additional objects and advantages of the invention will be set forth in the description which follows, and will be obvious from the description. The objects and advantages of the invention may be realized and obtained by means of a method, processes, instrumentalities and combinations, particularly pointed out in the claims.

A detailed description of non-limiting embodiments is presented hereinbelow with reference to the accompanying drawings, in which:

DETAILED DESCRIPTION

Figure 1:
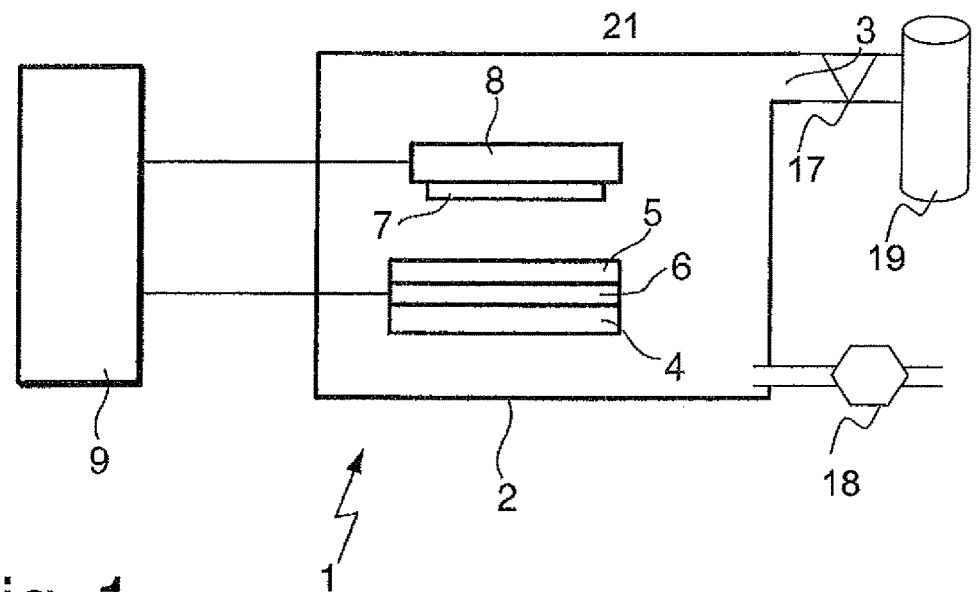
FIG. 1 is a schematic representation of an apparatus for magnetically enhanced sputtering.

FIG. 1 shows an apparatus 1, which is suitable for sputtering. The apparatus 1 comprises a plasma chamber 2, having a gas inlet 3 for providing a neutral gas. The plasma chamber 2 is vacuumed with a vacuum pump 18. Neutral gas to be ionized is let in via a valve 17 from a gas container 19.

In the plasma chamber 2 a magnet 4 is provided for providing a magnetic field at the surface of a sputtering target 5. The target 5 is provided on top of an electrode 6, configured as a cathode. In particular, the target 5 is in electrical connection with the cathode 6. Opposite the target 5 is provided a substrate 7 to be coated with target material. The substrate 7 is provided on an anode 8. The anode 8 and cathode 6 are connected with a high energy pulse power source 9 for applying voltage pulses between the anode 8 and the cathode 6 in the plasma chamber 2. The high energy pulse power source 9 can be controlled to produce pulses in order to produce a highly ionized plasma from the neutral gas as such that during a current rise period the plasma volume cross section increases while maintaining a substantially constant current density and/or a substantially constant ionization degree of the plasma, which is formed in the plasma chamber 2.

Figure 2:
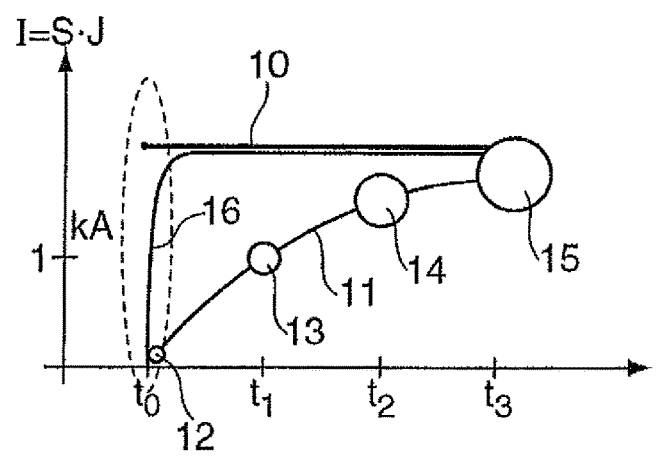
FIG. 2 is a diagram showing current, current density and ionization degree over time.

The diagram of FIG. 2 illustrates the formation of a highly ionized plasma. At time t0 a voltage pulse is applied between anode 8 and cathode 6 in order to provide a transition from a neutral gas to a highly ionized plasma. This means that upon application of a voltage pulse instantaneously a highly ionized plasma with a high ionization degree is formed. This is represented by line 10. As the current, which is represented by line 11 rises from t0 to t3, wherein the time interval between t0 and t3 represents a current rise period, the ionization degree represented by line 10 remains constant. At time t0 the volume 12 of the highly ionized plasma is relatively small. It increases with time, as the current rises. This is illustrated by the volumes 13, 14, and 15. As the volume of the ionized plasma grows, also the cross section of the ionized plasma increases. In FIG. 2 it can also be seen that the current density, which is represented by line 16 quickly rises to a high and constant value at time t0. The rise time of current density is normally less than 10 μs. Depending on circumstances like pressure, target material, magnetic field etc. the rise time may be less than 1 μs. From then on the current density remains constant during the current rise period. This means that the increase in ionized plasma volume is only due to an increase in current, whereas the current density and ionization degree remain constant.

Figure 3A:
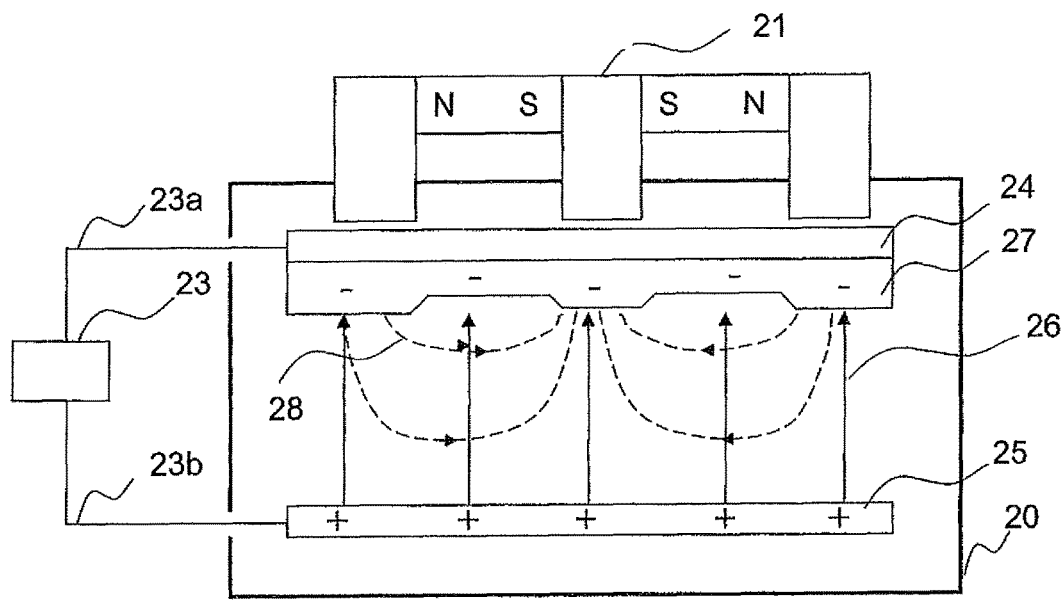
FIG. 3a is a schematic representation of an apparatus for magnetically enhanced sputtering.

FIG. 3a shows a schematic representation of an apparatus for magnetically enhanced sputtering with a high energy pulse power source 23 which is connected via a power line 23a to a cathode 24 and via a power line 23b to an anode 25. The anode 25 and cathode 24 are placed in a plasma chamber 20. The cathode 24 is in direct electrical connection with a target 27. When the high energy pulse power source 23 applies a pulse, an electrical field establishes between the anode 25 and the cathode 24. A strong magnet 21 is positioned behind the target which builds out a magnetic field. The field lines of the magnetic field 28 (dashed lines) are at least partially perpendicular to the field lines of the electrical field 26.

Figure 3B:
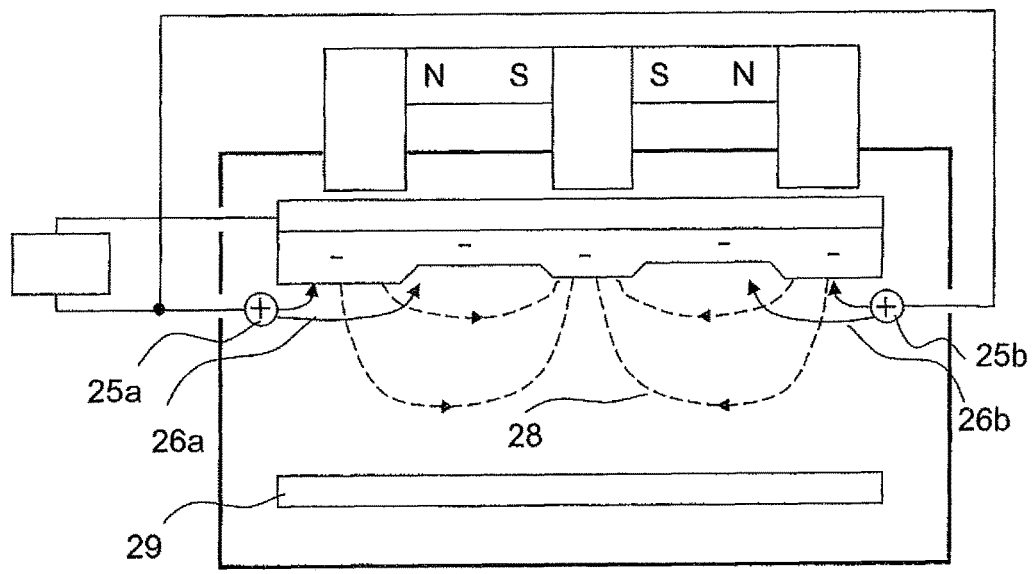
FIG. 3b is another schematic representation of an apparatus for magnetically enhanced sputtering.

FIG. 3b shows another schematic representation of an apparatus for magnetically enhanced sputtering, in which the same parts are not referenced again. FIG. 3b differs from FIG. 3a in the position and form of the anodes 25a, 25b, which is in FIG. 3b on both sides of the cathode. the field lines of the electrical field 26a, 26b are also at least partially perpendicular to the field lines of the magnetic field 28. In FIG. 3b is also shown a substrate 29, where sputtered atoms and/or ions may be deposited.

Figure 4A:
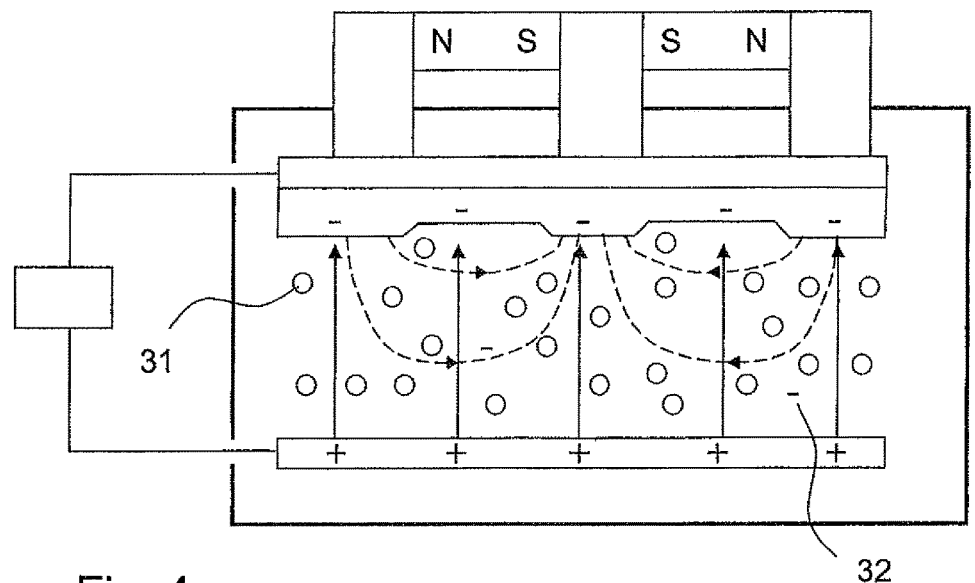
FIG. 4a is a schematic representation of an apparatus for magnetically enhanced sputtering with neutral gas and free electrons.

FIG. 4a is a schematic representation of an apparatus for magnetically enhanced sputtering with neutral gas and free electrons. The neutrons 31 are indicated as a 'o'; The electrons are indicated as '−'. With the electrical field the free electrons are accelerated towards the anode. The at least partially perpendicular magnetic field deviates the flow direction of the electrons. This leads to a completely different behavior of the now starting avalanche process as in breakdowns without such a magnetic field. The electrons are trapped to a volume near the cathode. As mentioned above, a neutral gas can be transformed to a plasma state by an electrical field breakdown in a gap between a cathode and an anode. The breakdown is a transformation process, where electrical charge multiplies and becomes homogeneous. Upon application of a voltage, a statistical time lag exists before the discharge starts to develop. This is followed by the acceleration of a free electron in the chamber which collides with gas atoms, ionizes them, creates more electrons, thereby initiating an electron ionization avalanche.

Figure 4B:
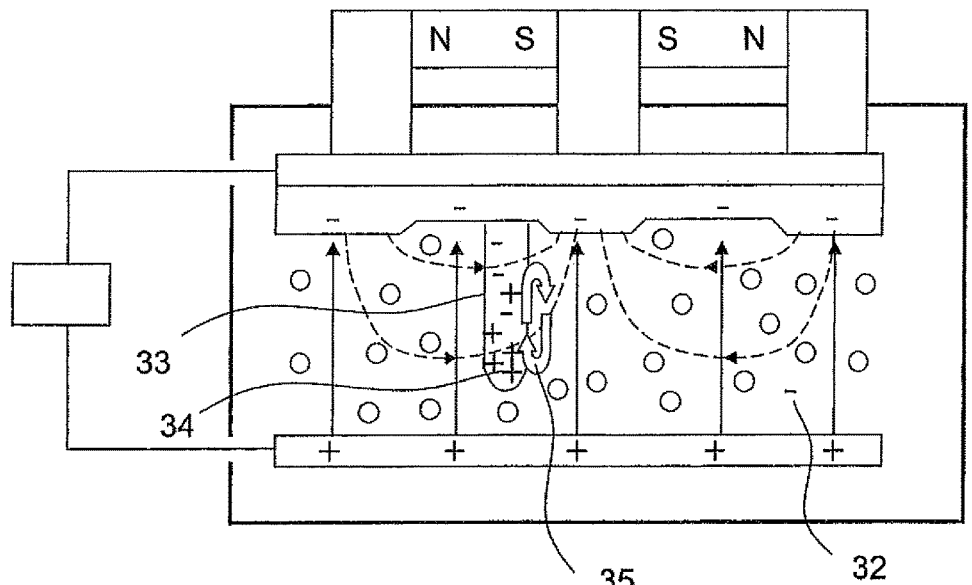
FIG. 4b is a schematic representation of an apparatus for magnetically enhanced sputtering with formation of an ionization wave.

FIG. 4b shows the apparatus of FIG. 4a with an ionization wave 33. As electrons from the avalanche reach the anode, they are absorbed and a positive ion charge 34 builds. The positive charged ions are indicated as a '+' and are accelerated by the electrical field towards the cathode. This gives rise to ionization waves that traverse the gap several times, which is indicated with arrows 35, the charge distribution becomes more homogeneous and a cathode and anode sheath form. In FIG. 4b is still indicated a free electron 32. More and more avalanches form (avalanche multiplication), increasing the cross sectional area and the number of ionized channels to the full face of the cathode. At this point a plasma is created and the discharge enters a state of spatial uniform glow. If the breakdown occurs with very high energy (caused by a dynamic voltage rise) the produced plasma is highly ionized. Typically an ionization degree of above 10 12 cm−3 describes a highly ionized plasma.

Figure 4C:
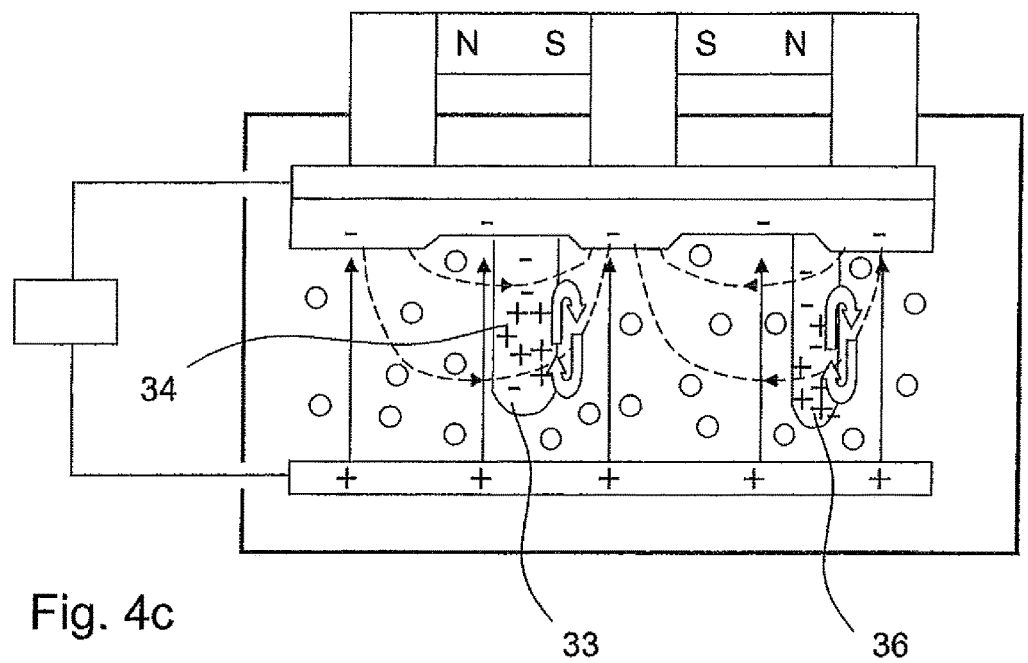
FIG. 4c is a schematic representation of an apparatus for magnetically enhanced sputtering with formation of two ionization waves.

FIG. 4c shows the apparatus of FIG. 4a with formation of two ionization waves 33 and 36. In the ionization wave 33 the positive charges have moved in direction of the cathode in respect to FIG. 4b. Also the spatial dimension and the cross section of the ionization wave 33 have increased compared to FIG. 4b.

Figure 4D:
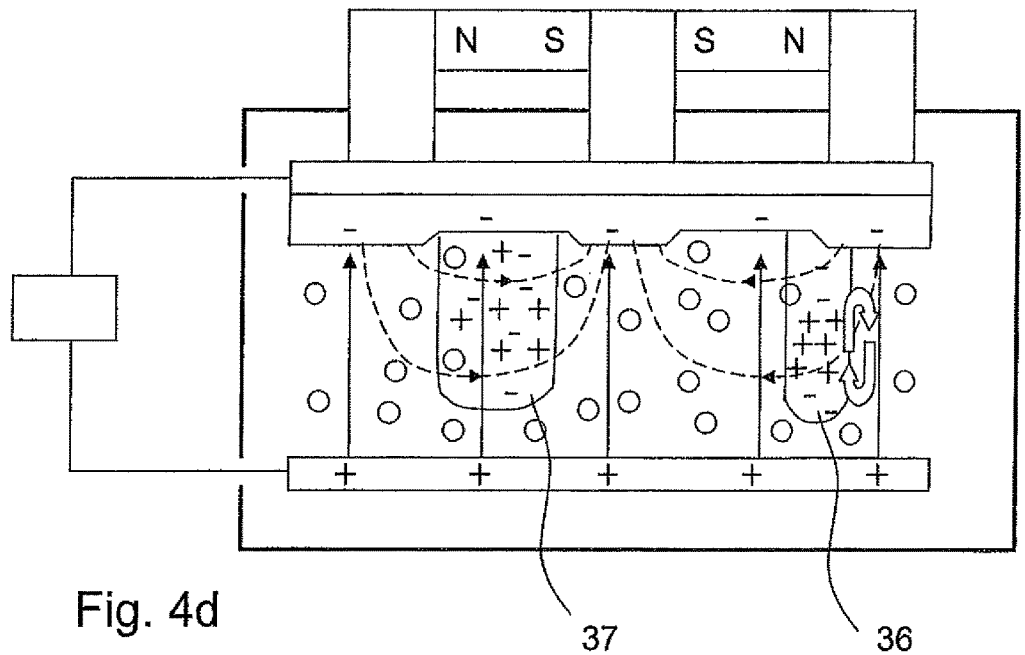
FIG. 4d is a schematic representation of an apparatus for magnetically enhanced sputtering with formation of an ionization wave and a growing plasma volume.

FIG. 4d shows the apparatus of FIG. 4a, b and c with formation of an ionization wave 36 and a growing highly ionized plasma volume 37.

Figure 5:
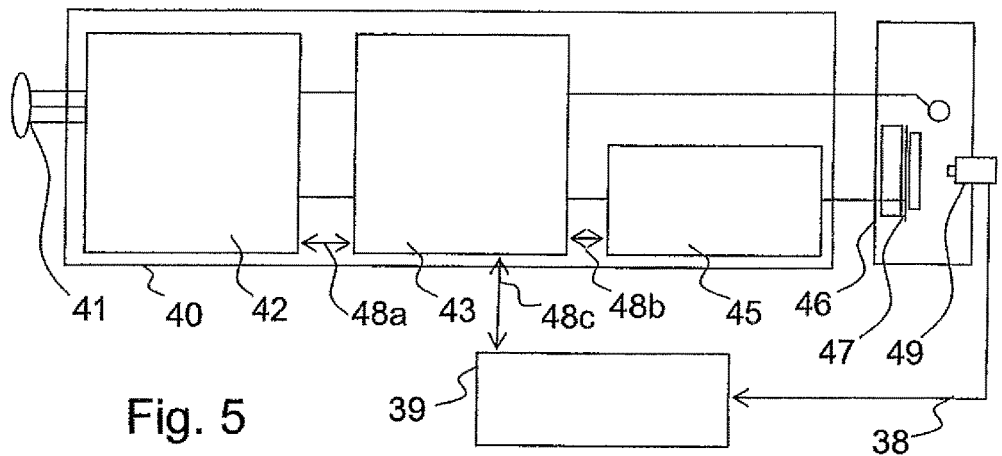
FIG. 5 is a schematic representation of an apparatus for magnetically enhanced sputtering with a more detailed view of the high energy pulse power source.

FIG. 5 shows a schematic representation of an apparatus for magnetically enhanced sputtering with a more detailed view of the high energy pulse power source 40. It has a connection to mains network via a power line and connector 41, which may be a plug. The power from the mains is connected to a DC power supply 42 which is known in the art. This may be a switch mode power supply with a transformer to disconnect the output potential from the mains potential. At the output of the DC power supply 42 a DC power is supplied via two or more power lines to a pulse unit 43. DC power supply 42 has also a communication and control line input and output, so it can be connected to the pulse unit or to an external control 39 which may be a panel or computer or to other parts. In FIG. 5 is shown a data communication line 48a between DC power supply 42 and pulse unit 43. A further data line 48c to an external control 39 is in FIG. 5 connected to the pulse unit 43. It may also be connected to the DC power supply 42. DC power supply 42 and pulse unit 43 may be placed in two separate housings or in one housing. A third data communication line 48b goes from the pulse unit 43 to the matching circuit 45. The matching circuit 45 is placed in the power line which goes from the pulse unit to the cathode 47 of the plasma chamber 46. The matching circuit is not absolutely necessary, but it gives the user the possibility to dampen oscillations, to shape the current waveform in order to achieve the highly ionized plasma without going through a low ionized plasma or through an arc discharge.

To ensure the plasma process starts at every high power pulse with the formation of a highly ionized plasma it is possible to monitor the plasma formation for example with a fast camera 49 which is connected to the external control 39 via a communication line 38. As mentioned above, the plasma development is dependent on a quite large number of parameters, some of which cannot be influenced by the pulse shape as it comes from the power supply. But it is possible to vary some parameters as for example the magnetic field strength and position by varying the position of the magnets. If the position of the field lines varies because of target erosion, it is possible to vary the electrical behavior of the high power pulse via external control or via modification of the matching circuit 45.

Figure 6:
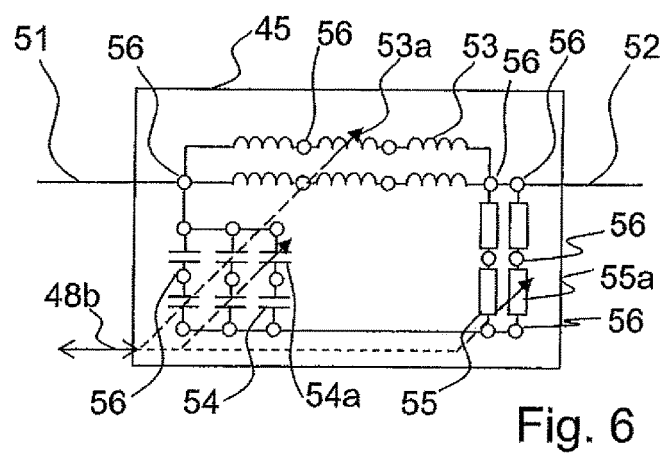
FIG. 6 is a schematic representation of a matching circuit.

FIG. 6 shows a schematic representation of a matching circuit 45. It includes one or several inductors 53, some of them may be variable like indicated with inductor 53a. It includes further one or more capacitors 54, some of them may be variable like indicated with capacitor 54a. It includes further one or more resistors 55, some of them may be variable like indicated with resistor 55a. Resistors, inductors and capacitors are replaceable, it is possible to shortcut them. This is all possible due to connection means 56. Not all connection means in FIG. 6 are referenced with a number. So there is a big variety to shape the pulse form. The variable element can also be controlled electrically by external control.

Figure 7:
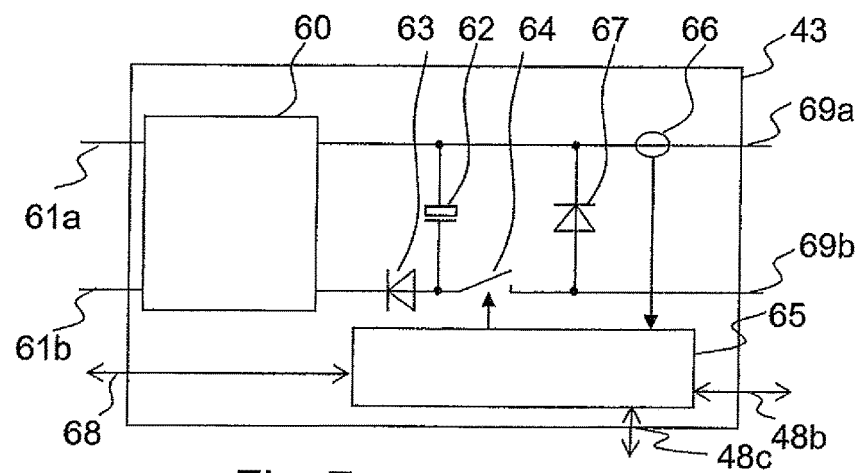
FIG. 7 is a schematic representation of a pulse unit.

FIG. 7 shows a schematic representation of a pulse unit 43. It includes a charge current shaping unit 60 which is connected via power lines 61a, 61b to the DC power supply 42. The charge current shaping unit 60 delivers current via a charging diode 63 to charge a capacitor 62. The capacitor 62 may be a capacitor bank of several parallel and serial connected capacitors to store enough energy for the high energy pulses. The pulse unit 43 includes also a pulse control 65 which controls a switch 64. The switch 64 closes for short controllable pulse durations of 1 µs to 300 µs. It may be a bank of MOSFET switches connected in series and parallel, all switched on and off at the same time in order to lead the high current and to switch the high voltage of the high energy, high power pulse. When the switch 64 turns off, the current in the power lines 69a, 69b, which lead to the plasma chamber via the optional matching circuit 45, will continue to flow due to inherent inductances in the matching circuit and in the power lines. In order to avoid destruction of the pulse unit 43, especially the switch 64, a freewheeling diode 67 is provided between the lines 69a and 69b. A current sensor 66 is included which gives a signal corresponding to the current into the plasma chamber to the pulse control 65.

Figure 8:
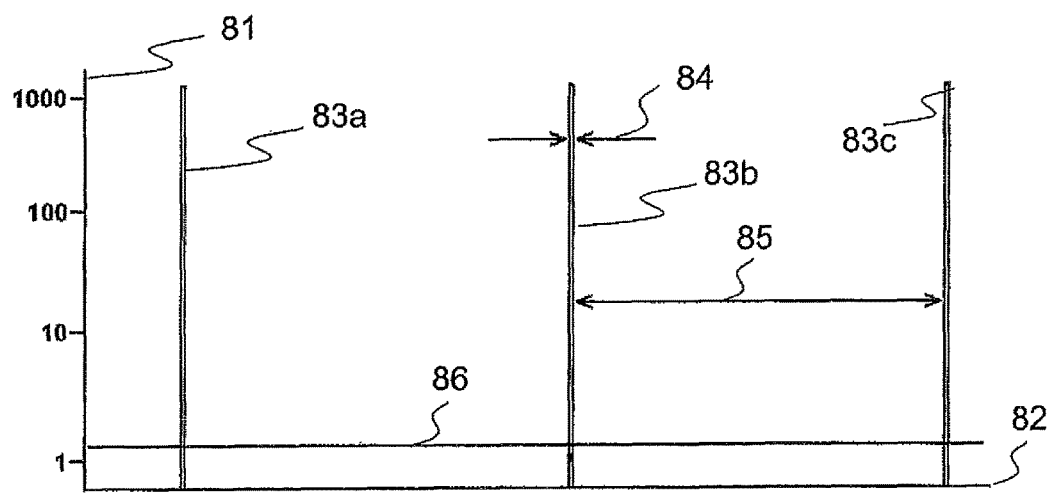
FIG. 8 is a diagram showing a pulse power.

FIG. 8 shows a diagram of a typical pulse duration and repetition time. On the vertical axis the power is indicated in kilowatts. This means the shown pulses have a peak power of about 1 MW. On the horizontal axis is the time scale. Three pulses 83a, 83b, 83c are shown. They may have a repetition time 85 of about 1 ms to 1 s. The pulse duration 84 may be between 1 µs and 300 µs. Even longer pulse duration times are possible if a current control or regulation is implemented which will be explained later on. In the diagram is also shown the average delivered power 86 which is in this case about 1.5 kW which is a typical value for sputtering purposes with large areas to coat.

Figure 9:
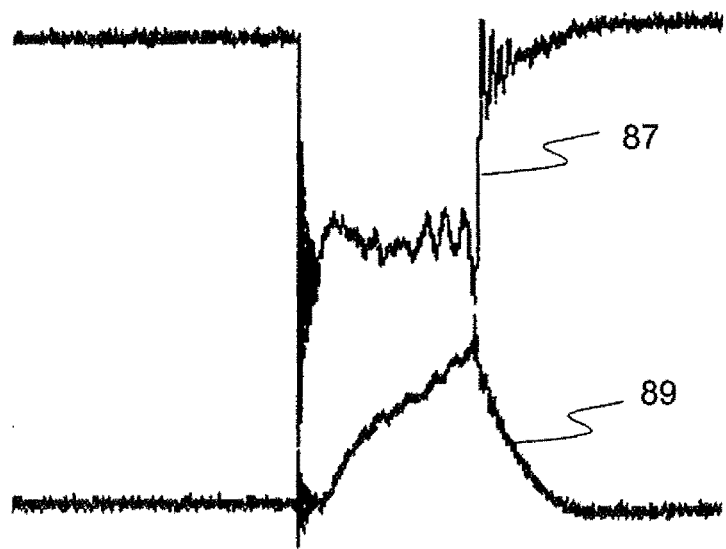
FIG. 9 is a diagram showing a voltage and current waveform of the high energy, high power pulse.
Figure 10:
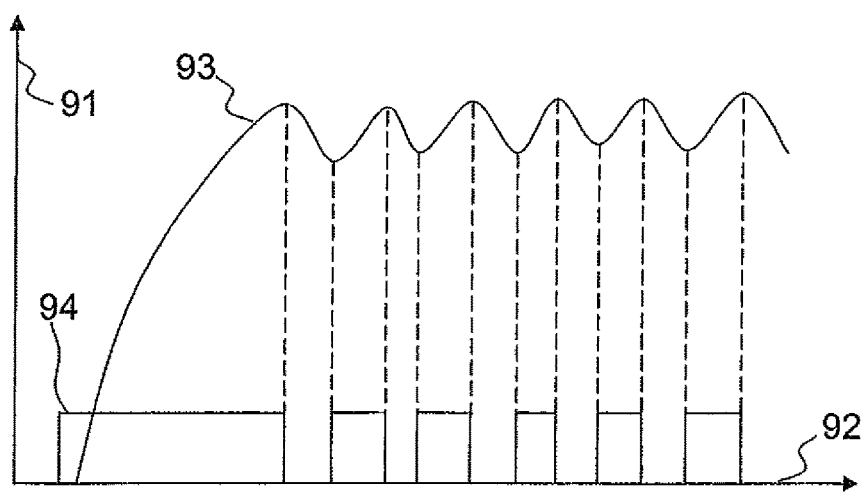
FIG. 10 is a diagram showing a current waveform of the high energy, high power pulse.

FIG. 9 shows a diagram with a typical voltage waveform 87 and a current waveform 89 of the high power pulse;

FIG. 10 shows a diagram with a typical current waveform of the high power pulse, if the pulse should be longer than 300 µs. If the duration of the pulse should be longer than about 300 µs the risk to come into an arc discharge rises. Arc discharges should be avoided, because they lead to target and substrate damages. Arc discharges can be detected by a huge current rise or a huge current rise velocity. This can be monitored with the current sensor 66, and when an arc discharge is detected, the switch 64 may be opened immediately by pulse control 65. The arc then quenches in about 100 µs. Only the remaining energy in the power lines and matching circuit is delivered to the plasma, which is often too much. To avoid even the delivery of this energy a further arc diverter is necessary which will be explained later on.

To avoid the arcing it is advantageous to control or to limit the current after a time of about 1 µs to 200 µs. This can also be done with the current sensor 66 and with the pulse control 65. If the current rises over a given threshold, which may be variable, the switch 64 is turned off. As can be seen from FIG. 9, the current does not break down immediately but falls with an e-function. If the current is further monitored, the switch 64 can be closed again, when the monitored current falls below a given second threshold. It is also possible to wait a given time before reclosing the switch. In this way the current can be regulated as shown in FIG. 10. The signal 94 shows the switching on and off of the switch 64. The waveform 93 is the waveform of the current measured with the current sensor 66.

Figure 11:
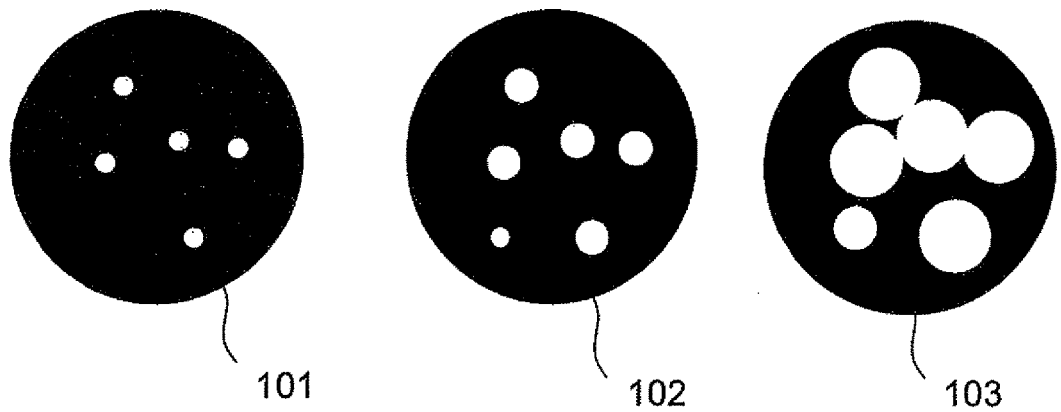
FIG. 11 shows three views of building up of highly ionized plasma volumes.

FIG. 11 shows some typical views which may be obtained by a camera 49 shown in FIG. 5. In the picture 101 the formation of five highly ionized plasma volumes is seen. In picture 102 which is a picture taken some nanoseconds later, these five plasma volumes have already grown. Also a new sixth plasma volume has formed. At picture 103 which is again some nanoseconds later all, six plasma volumes have increased again. It is easy to imagine how a uniform plasma builds in this way. Whether the plasma is really highly ionized and whether ionized atoms of the sputtered material are as well present, is detectable via spectroscopic filters or pictures of this view. If this monitoring shows that the high ionization starts up from the beginning, than all parameters are well set. If this monitoring shows that the highly ionization starts after a low ionization stage, then parameters such as values listed above should be changed.

Figure 12:
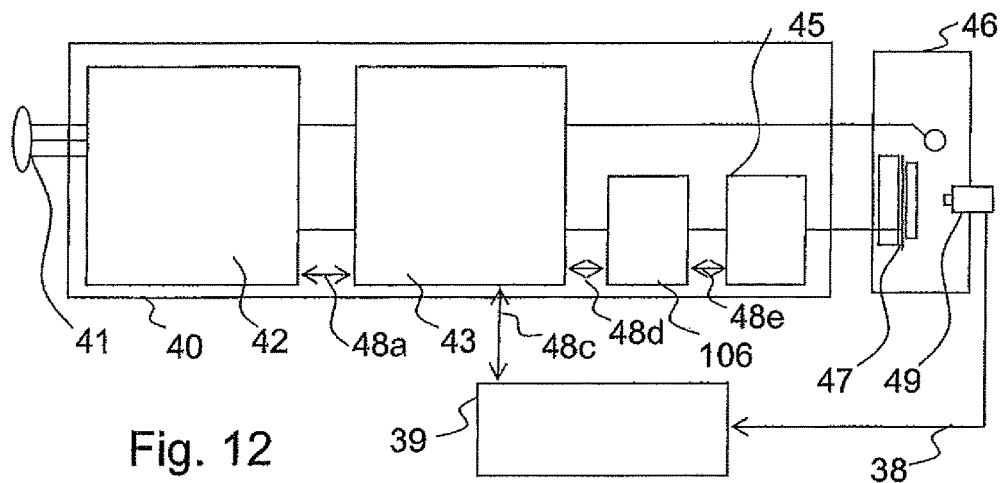
FIG. 12 shows a schematic representation of an apparatus for magnetically enhanced sputtering as in FIG. 5 with an additional energy absorber circuit.

FIG. 12 shows a schematic representation of an apparatus for magnetically enhanced sputtering as in FIG. 5 with an additional energy absorber circuit 106. Also this circuit has a data communication line 48d and is in connection with the external control 39, the pulse unit 43 and the DC power supply 42. There may also be an optional data connection 48e to the matching unit 45. The additional energy absorber circuit 106 is configured to absorb the energy, at least partly, which is stored in the power lines from the high energy pulse power source 40 to the plasma chamber 46. It may also at least partly absorb the energy which is stored in the plasma chamber 46. This energy absorber circuit 106 is configured to be activated when a sensor such as the current sensor 77 of the pulse unit 43 (FIG. 7) detects an abnormal current rise. This may be caused by an arc discharge in the plasma chamber. As mentioned earlier, when an arc discharge is detected, the switch 64 may be opened immediately by pulse control 65. The arc then quenches in about 100 µs. Only the remaining energy in the power lines and matching circuit 45 is delivered to the plasma, which is often too much. To avoid even the delivery of this energy at least partly, the energy absorber circuit 106 is activated.

Figure 13:
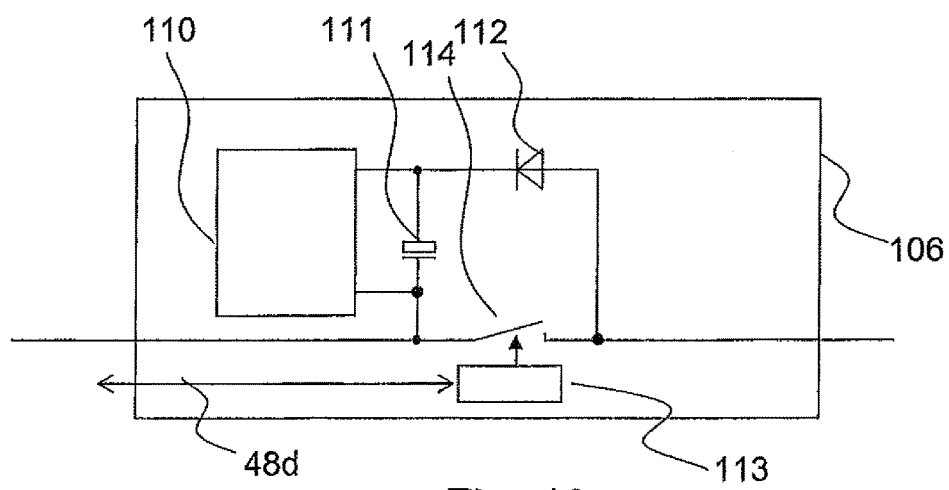
FIG. 13 shows energy absorber circuit of FIG. 12 in more detail.

FIG. 13 shows such an energy absorber circuit 106 in more detail. A control section 113 controls a switch 114 which is normally closed. In case of abnormal current rise or arc detection this switch opens as quickly as possible. The current which flows at this moment in the power lines between the high energy pulse power source 40 and the plasma chamber 46 keeps on flowing due to the inherent inductance in the power lines. The current flows now via the diode 112 into the capacitor 111. A precharging and discharging circuit 110 is connected to the capacitor 111. It precharges the capacitor 111 to a defined voltage, which helps to absorb the energy as quickly as possible. The current decreases while the capacitor 111 will be charged by the current. To avoid an overvoltage at the capacitor 111 after several activations of the energy absorber circuit 106, the capacitor 111 must be discharged. This can be done by a discharging circuit, which may be also implemented in the precharging and discharging circuit 110. The capacitor 111 may also be placed in the DC power supply and the energy which comes from the power lines into the capacitor may be used to charge the capacitors 62 of the pulse unit 43.

Figure 14:
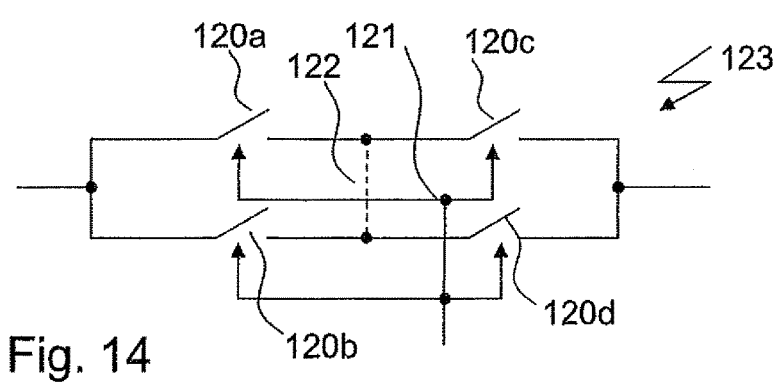
FIG. 14 shows a bank of switches connected in series and parallel.

FIG. 14 shows a bank of switches 123 which comprises four switches 120a, 120b, 120c, 120d connected in series and parallel. This is a configuration as it may be used for the switch 64 of the pulse unit 43 or for the switch 114 of the energy absorber circuit 106. All four switches 120a, 120b, 120c, 120d, which may be MOSFETs, are switched on and off at the same time. They are controlled via a control line 121. A connection 122 between both series connected switch pairs 120a, 120c and 120b, 120d is optional.

A number of embodiments of the invention have been described. Nevertheless, it will be understood that various modifications may be made without departing from the spirit and scope of the invention. Accordingly, other embodiments are within the scope of the following claims.

What is claimed is:

1. A method of generating a highly ionized plasma in a plasma chamber, the method comprising:
   providing a neutral gas to be ionized in the plasma chamber at pressure below 50 Pa;
   supplying at least one high energy, high power electrical pulse with power equal or larger than 100 kW and energy equal or larger than 10 J, to at least one magnetron cathode in connection with a target in the plasma chamber;
   producing a highly ionized plasma directly from the neutral gas in a plasma volume, without going through a non-highly ionized plasma, without going through a glow discharge, and without going through an arc discharge, such that the plasma volume cross section increases during a current rise period;
   sputtering atoms from the target with the highly ionized plasma; and
   ionizing at least part of the sputtered atoms.

2. The method of claim 1, wherein, during the current rise period, a spatial growth of highly ionized regions in the plasma chamber is initiated.

3. The method of claim 1, wherein the high energy, high power pulse is not longer than 500 µs.

4. The method of claim 1, wherein a substantially constant current density and/or a substantially constant ionization degree is maintained while the plasma volume cross section increases during the current rise period.

5. The method of claim 1, wherein the voltage, current or power pulse are selected to produce at least as many ionized atoms of the provided gas as it produces ionized atoms of sputtered material.

6. The method of claim 1, wherein one or more electron avalanches are initiated in the neutral gas prior to a steady plasma state.

7. The method of claim 1, wherein one or more ionization waves are initiated prior to a steady plasma state.

8. The method of claim 1, wherein the high energy, high power pulse is applied between a cathode and an anode of the plasma chamber causing one or more electron avalanches followed by one or more ionization waves.

9. The method of claim 1, wherein the high energy, high power pulse is applied to at least one electrode where a resulting voltage across the at least one electrode and a second electrode is higher than a static breakdown voltage or a dynamic breakdown voltage.

10. The method of claim 1, wherein the high energy, high power pulse is selected such that a voltage between the electrode and the plasma chamber or between an anode and a cathode in the plasma chamber reaches more than 80% of its maximum value, before the current density or the ionization degree in the plasma chamber reaches more than 80% of its maximum value.

11. The method of claim 1, wherein the high energy, high power pulse is selected such that the current density or the ionization degree in the plasma chamber reaches more than 30% of its maximum value before the current into the electrode reaches more than 80% of its maximum value.

12. The method of claim 1, wherein the high energy, high power pulse is selected such that the number of avalanches rises during the current rise period.

13. A method of generating a highly ionized plasma in a plasma chamber, the method comprising:
providing a neutral gas to be ionized in the plasma chamber at pressure below 50 Pa;
supplying at least one high energy, high power electrical pulse with power equal or larger than 100 kW and energy equal or larger than 10 J, to at least one magnetron cathode in connection with a target in the plasma chamber; and
producing a highly ionized plasma directly from the neutral gas in the plasma chamber, without going through a non-highly ionized plasma, without going through a glow discharge, and without going through an arc discharge, such that during a current rise period a current density in the plasma chamber reaches more than 80% of its maximum value before the current into the electrode reaches more than 80% of its maximum value.

14. The method of claim 13, wherein, during the current rise period a spatial growth of highly ionized regions in the plasma chamber is initiated.

15. An apparatus for magnetically enhanced sputtering, the apparatus comprising:
at least one magnet configured to provide a magnetic field in a magnetron configuration at a surface of a sputtering target, from which material is to be sputtered;
a plasma chamber configured to receive the sputtering target, the chamber having an inlet for introduction into the chamber of a neutral gas to be ionized;
an anode and a cathode in the chamber, the cathode in electrical connection with the target; and
a high energy pulse power source configured to apply a high energy, high power electrical pulse with power equal or larger than 100 kW and energy equal or larger than 10 J, between the anode and the cathode in the chamber;
wherein responsive to said high energy pulse power source a highly ionized plasma is generated directly from the neutral gas in a plasma volume, without going through a weakly non-highly ionized plasma, without going through a glow discharge, and without going through an arc discharge such that the plasma volume cross section increases during a current rise period.

16. The apparatus of claim 15, wherein during at least of a part of the current rise period a substantially constant current density and/or a substantially constant ionization degree is maintained.

17. The apparatus of claim 15, wherein the high energy pulse power source produces a voltage pulse such that a degree of ionization of at least $10^{12}$ cm-3 is reached.

18. The apparatus of claim 15, wherein the apparatus is configured to produce a high energy, high power electrical pulses with power equal or larger than 100 kW, and energy equal or larger than 10 J, to be supplied to at least one magnetron cathode of a plasma chamber in less than 200 µs for producing a highly ionized plasma from a neutral gas in the plasma chamber, the source being configured such that the voltage between an anode and a cathode in a plasma chamber reaches more than 80% of its maximum value, before the current density reaches more than 80% of its maximum value.

19. The apparatus of claim 18, wherein the high energy, high power pulse is configured such that the current density in the plasma chamber reaches more than 30% of its maximum value before the current into the electrode reaches more than 80% of its maximum value.

20. The apparatus of claim 18, wherein the high energy pulse power source comprises a matching circuit with configurable inductors and/or capacitors and/or resistors.

21. The method of claim 9, wherein the pulse supplies enough current and/or power rise capacity that a highly ionized plasma is generated without going through a non-highly ionized plasma or through an arc discharge.

* * * * *

UNITED STATES PATENT AND TRADEMARK OFFICE
CERTIFICATE OF CORRECTION

PATENT NO.        : 9,840,770 B2  
APPLICATION NO.   : 14/138400  
DATED             : December 12, 2017  
INVENTOR(S)       : Andrzej Klimczak, Pawel Ozimek and Rafal Bugyi Page 1 of 1

It is certified that error appears in the above-identified patent and that said Letters Patent is hereby corrected as shown below:

In the Claims

<u>Column 14</u>  
Line 11, in Claim 15, after "through a" delete "weakly"  
Line 13, in Claim 15, delete "discharge" and insert -- discharge, --

Signed and Sealed this  
Twenty-second Day of May, 2018

Andrei Iancu  
*Director of the United States Patent and Trademark Office*